United States Patent
Ashizawa et al.

(10) Patent No.: US 9,963,784 B2
(45) Date of Patent: May 8, 2018

(54) FILM FORMING METHOD AND FILM FORMING APPARATUS

(71) Applicant: Tokyo Electron Limited, Tokyo (JP)

(72) Inventors: Hiroaki Ashizawa, Yamanashi (JP); Misuzu Sato, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 255 days.

(21) Appl. No.: 14/516,460

(22) Filed: Oct. 16, 2014

(65) Prior Publication Data
US 2015/0110959 A1    Apr. 23, 2015

(30) Foreign Application Priority Data
Oct. 18, 2013  (JP) .................. 2013-217327

(51) Int. Cl.
| C23C 16/00 | (2006.01) |
| C23C 16/52 | (2006.01) |
| C23C 16/34 | (2006.01) |
| C23C 16/44 | (2006.01) |
| C23C 16/455 | (2006.01) |

(52) U.S. Cl.
CPC .............. *C23C 16/52* (2013.01); *C23C 16/34* (2013.01); *C23C 16/4412* (2013.01); *C23C 16/45525* (2013.01); *C23C 16/45544* (2013.01)

(58) Field of Classification Search
CPC ......... C23C 16/52; C23C 16/34; C23C 16/08; C23C 16/45544; C23C 16/45525; C23C 16/45502; C23C 16/45557
See application file for complete search history.

(56) References Cited

U.S. PATENT DOCUMENTS 5,240,603 A  *  8/1993  Frank ................. B01D 11/0203
                                               203/49
2003/0116087 A1*  6/2003  Nguyen ................. C23C 16/34
                                               118/715

(Continued)

FOREIGN PATENT DOCUMENTS

| JP | 2004-091874 | 3/2004 |
| JP | 2009-224775 | 1/2009 |
| KR | 10-2001-0066730 A | 7/2001 |

(Continued)

OTHER PUBLICATIONS

Takashi et al., Deposition Method, English Abstract for JP 2004-091874, Mar. 25, 2004, http://www19.ipdl.inpit.go.jp.

(Continued)

*Primary Examiner* — Kelly M Gambetta

(57) ABSTRACT

A film forming method includes: forming a thin unit film on a target substrate by supplying processing gases sequentially and intermittently into a processing space, where the target substrate is placed, in a processing chamber of a film forming apparatus while purging the processing gases with a purge gas constantly supplied into the processing space; and repeating the forming of the thin unit film to form a film having a predetermined thickness on the target substrate. A flow rate of the purge gas supplied into the processing space is set such that the film is formed in a film forming mode in which the thin unit film is formed, irrespective of a pressure in the processing chamber.

8 Claims, 9 Drawing Sheets

(56) References Cited

U.S. PATENT DOCUMENTS

| | | | | |
|---|---|---|---|---|
| 2003/0143841 A1* | 7/2003 | Yang | ............ | C23C 16/06 |
| | | | | 438/656 |
| 2006/0269667 A1* | 11/2006 | Ma | ............ | C23C 16/448 |
| | | | | 427/248.1 |

FOREIGN PATENT DOCUMENTS

| KR | 10-2005-0071353 A | 7/2005 |
|---|---|---|
| KR | 10-2010-0124198 A | 11/2010 |

OTHER PUBLICATIONS

Tsuda Einosuke., Gas Supply Equipment, Film-Forming Apparatus, and Film Formation Method, Abstract for JP 2009-224775, Jan. 10, 2009, http://www19.ipdl.inpit.go.jp.

* cited by examiner

FILM FORMING METHOD AND FILM FORMING APPARATUS

CROSS-REFERENCE TO RELATED APPLICATIONS

This application claims priority to Japanese Patent Application No. 2013-217327 filed on Oct. 18, 2013, the entire contents of which are incorporated herein by reference.

FIELD OF THE INVENTION

The present invention relates to a film forming method and a film forming apparatus.

BACKGROUND OF THE INVENTION

In the field of semiconductor device manufacturing, an atomic layer deposition (hereinafter referred to as ALD) attracts attention as a technique to form a certain film on a semiconductor wafer (hereinafter simply referred to as a wafer) which is a substrate.

According to the ALD technique, a film having a desired thickness is formed by repeating plural times an operation of forming a thin unit film, which is almost monomolecular layer. The operation of forming a thin unit film includes: sequentially supplying processing gases (precursors) for forming a desired film into a processing space, where a target substrate is placed, in a processing chamber; purging (substituting) excessive processing gases with a purge gas (substitution gas) after the supplying of the processing gases; and reacting the processing gases with each other on the wafer to form a thin unit film (see, e.g., Japanese Patent Application Publication No. 2004-091874). As an example, a method to form a TiN film is known, in which $TiCl_4$ gas and $NH_3$ gas are used as the processing gases, and supplying each of the gases is repeated several times, with purging being carried out between the supplying of each of the gases.

The ALD technique is advantageous in that film thickness can be controlled with a high precision by the number of repeated cycles, and in that a film of good quality can be produced at a low temperature with excellent step coverage.

In the ALD technique, purging of the processing gases is carried out after the supplying of each of the processing gases in order to remove excessive processing gases from the processing space. Consequently, reactions occur only on a surface of a wafer, thereby maintaining good control of film thickness. Additionally, the purging is carried out to prevent reaction products, which contribute to particles, from being generated when the processing gases react with each other in the processing space.

In addition, in order to improve the control over film thickness in the ALD technique, it is necessary to increase purge efficiency so as to improve substitution rate of gases in the processing space during the purging. To this end, it is preferred to make the processing space as narrow as possible (see, e.g., Japanese Patent Application Publication No. 2009-224775). Further, in order to efficiently perform the supplying of the processing gases into the processing space and the purging, and in order to improve the substitution of the gases in the processing space so as to ensure control over film thickness, it has been contemplated that it is necessary to make the pressure in the processing space as low as possible and to increase the flow rate of the purge gas.

However, a film forming apparatus typically has a trap for trapping reaction products flowing in an exhaust line, and the trap limits the substitution rate of gases when the pressure in a processing space is low, so that it is difficult to sufficiently increase the gas substitution efficiency.

SUMMARY OF THE INVENTION

In view of the above, the present invention provides a film forming method and a film forming apparatus that can ensure good control over film thickness by improving gas substitution efficiency in a processing space when a film is formed by the atomic layer deposition technique.

When a film is formed by the ALD technique, processing gases are supplied onto a substrate and subsequently excessive processing gases are purged out. By doing so, only surface reaction takes place and thus film thickness is controlled in a self-limiting manner, so that a unit film of an almost monomolecular layer is formed (an ALD mode). Conventionally, if the pressure in a processing space increases, gas substitution efficiency decreases, so that deposition such as CVD (chemical vapor deposition) takes place (a CVD mode)), as well as surface reaction. Therefore, it has been considered that control over film thickness becomes poor. For this reason, in a conventional case, in order to improve substitution rate of gases in the processing space, the pressure in the processing space is reduced and the flow rate of a purge gas is increased. However, if the pressure in the processing space is reduced, a trap for trapping reaction products flowing in an exhaust line limits the substitution rate of gases. Accordingly, there is a dilemma that the gas substitution efficiency decreases eventually.

Under the circumstances, the present inventors conducted several examinations and have found that, a film can be formed in the ALD mode by increasing the flow rate of a purge gas, in a state where the purge gas is constantly supplied to the processing space and processing gases are sequentially and intermittently supplied, even if the pressure in the processing space is increased. In other words, it has been found that, by increasing the flow rate of the purge gas to a predetermine flow rate or above, good control of film thickness can be achieved in the ALD mode, irrespective of the pressure in the processing space.

In accordance with a first aspect of the present invention, there is provided a film forming method, including: forming a thin unit film on a target substrate by supplying processing gases sequentially and intermittently into a processing space, where the target substrate is placed, in a processing chamber of a film forming apparatus while purging the processing gases with a purge gas constantly supplied into the processing space; and repeating the forming of the thin unit film to form a film having a predetermined thickness on the target substrate, wherein a flow rate of the purge gas supplied into the processing space is set such that the film is formed in a film forming mode in which the thin unit film is formed, irrespective of a pressure in the processing chamber.

In accordance with a second aspect of the present invention, there is provided a film forming method, including: forming a thin unit film on a target substrate by supplying processing gases sequentially and intermittently into a processing space, where the target substrate is placed, in a processing chamber of a film forming apparatus while purging the processing gases with a purge gas constantly supplied into the processing space; and repeating the forming of the thin unit film to form a film having a predetermined thickness on the target substrate, wherein the film forming apparatus comprises an exhaust unit having a trap for trapping byproducts produced by a reaction between the processing gases, a pressure in the processing space is set high so that the trap does not limit substitution rate of the purge gas supplied into the processing space, and a flow rate of the purge gas is set such that the film is formed in a film forming mode in which the thin unit film is formed at the high pressure.

In accordance with a third aspect of the present invention, there is provided a film forming apparatus, including: a processing chamber configured to accommodate a substrate therein, wherein a film forming process is carried out on the substrate in a processing space defined in the processing chamber; a mounting table arranged in the processing chamber and configured to mount the substrate thereon; a gas supply unit configured to supply processing gases and a purge gas into the processing space; an exhaust unit configured to discharge gases in the processing space; and a control unit configured to control the film forming process including: forming a thin unit film by supplying processing gases sequentially and intermittently into the processing space while purging the processing gases with a purge gas constantly supplied into the processing space; and repeating the forming of the thin unit film to form a film having a predetermined thickness on the substrate, wherein the control unit controls a flow rate of the purge gas supplied into the processing space such that the film is formed in a film forming mode in which the thin unit film is formed, irrespective of a pressure in the processing chamber.

In accordance with a fourth aspect of the present invention, there is provided a film forming apparatus, including: a processing chamber configured to accommodate a substrate therein, wherein a film forming process is carried out on the substrate in a processing space defined in the processing chamber; a mounting table arranged in the processing chamber and configured to mount the substrate thereon; a gas supply unit configured to supply processing gases and a purge gas into the processing space; an exhaust unit configured to discharge gases in the processing space, the exhaust unit including a trap for trapping byproducts produced by a reaction between the processing gases; and a control unit configured to control the film forming process including: forming a thin unit film by supplying processing gases sequentially and intermittently into the processing space while purging the processing gases with a purge gas constantly supplied into the processing space; and repeating the forming of the thin unit film to form a film having a predetermined thickness on the substrate, wherein the control unit controls a pressure in the processing space to be high so that the trap does not limit substitution rate of the purge gas supplied into the processing space and a flow rate of the purge gas such that the film is formed in a film forming mode in which the thin unit film is formed at the high pressure.

In accordance with a fifth aspect of the present invention, there is provided a storage medium that runs on a computer and stores therein a program for controlling a film forming apparatus, wherein the program, when executed, causes the computer to control the film forming apparatus to perform the film forming method of the first or the second aspect.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings. Herein, an example will be described in which a TiN film is formed by the ALD technique by using, as processing gases, titanium tetrachloride ($TCl_4$) gas which is a Ti source gas and ammonia ($NH_3$) gas which is nitride gas.

(Configuration of Film Forming Apparatus)

Figure 1:
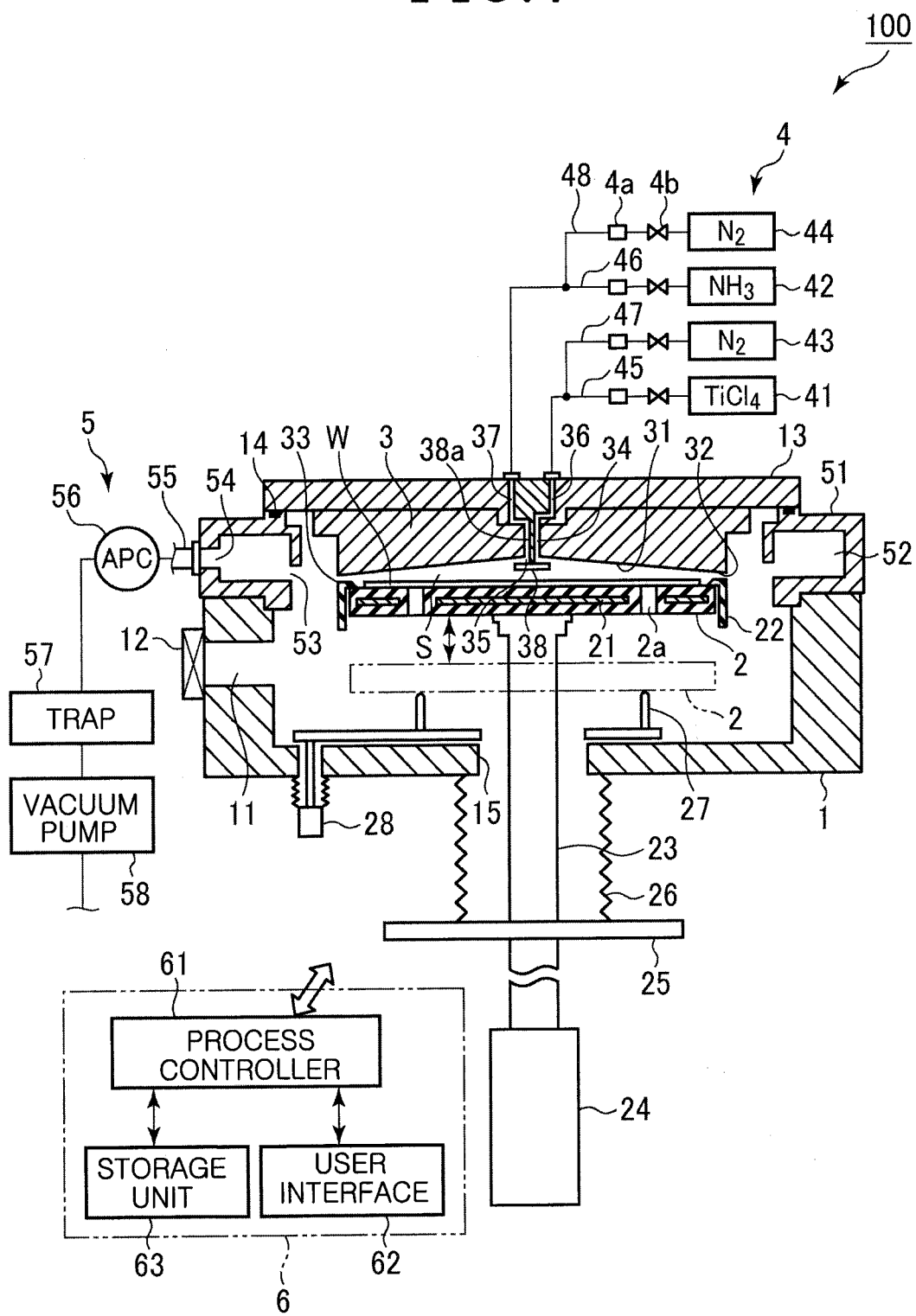
FIG. 1 is a cross-sectional view of an example of a film forming apparatus for performing a film forming method in accordance with the present invention.
Figure 2:
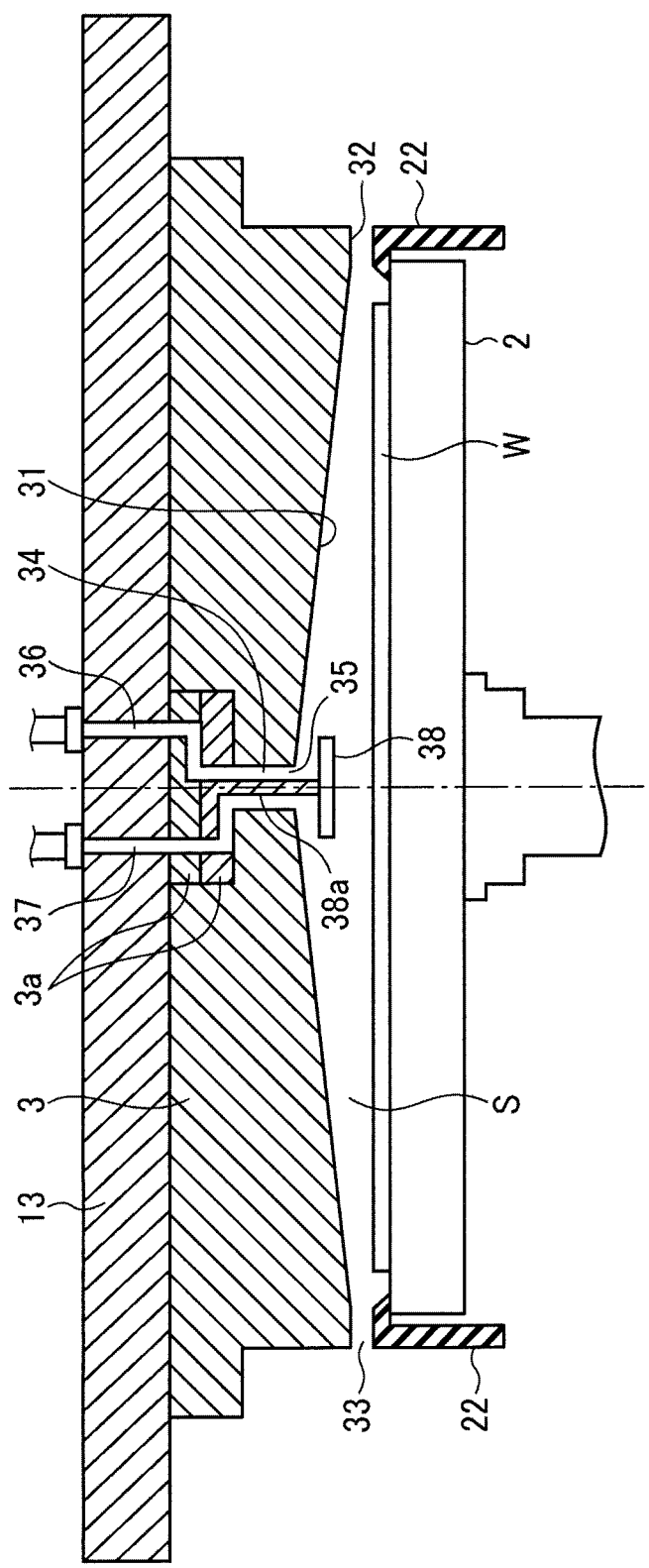
FIG. 2 is an enlarged cross-sectional view of major parts of the film forming apparatus illustrated in FIG. 1.

FIG. 1 is a cross-sectional view of an example of a film forming apparatus for performing a film forming method in accordance with an embodiment of the present invention. FIG. 2 is an enlarged cross-sectional view of major parts of the film forming apparatus illustrated in FIG. 1.

As illustrated in FIG. 1, the film forming apparatus 100 includes: a processing chamber 1 that is made of a metal such as aluminum, the inside of which is held in a vacuum state; a mounting table 2 that is provided in the processing chamber 1 and allows a wafer W to be mounted thereon; a cap member 3 that faces the mounting table 2, a processing space S being defined between the cap member 3 and the mounting table 2; a gas supply unit 4 that supplies processing gases and a purge gas into the processing space S; an exhaust unit 5 by which gases in the processing space S are exhausted; and a control unit 6.

At the sidewall of the processing chamber 1, a loading/unloading port 11 through which the wafer W is loaded and unloaded is provided. The loading/unloading port 11 is opened and closed by a gate valve 12.

At the upper sidewall portion of the processing chamber 1 higher than the loading/unloading port 11, an annular exhaust duct 51 is provided. As will be described below, the exhaust duct 51 works as one element of the exhaust unit 5. The top surface of the processing chamber 1 (namely, the top surface of the exhaust duct 51) is an open surface having a circular opening. A top plate 13 is provided so as to cover the opening. An O-ring 14 is disposed between the exhaust duct 51 and the top plate 13 so as to ensure airtightness of the processing chamber 1.

The mounting table 2 is located in an area inside from the whole of the annular exhaust duct 51 and has a disc shape slightly larger than the wafer W. The mounting table 2 is made of, e.g., ceramic such as aluminum nitride (AlN) or metal such as nickel-base alloy. Inside the mounting table 2, a heater 21 is installed so as to heat the wafer W up to a film forming temperature of, e.g., 350° C. to 550° C. Further, an electrostatic chuck may be provided so as to hold the wafer W on the upper surface of the mounting table 2, if necessary.

Around the mounting table 2, a cover member 22 is provided to cover the circumferential side surface of the mounting table 2 and the outer peripheral surface of the mounting table 2, which is located outside the area where a wafer W is mounted. The cover member 22 is made of, e.g., alumina.

A supporting member 23 is connected to the center of the lower surface of the mounting table 2. The supporting member 23 extends downwardly from the lower surface of the mounting table 2 to pass through an opening 15 formed in a bottom wall of the processing chamber 1. An elevation mechanism 24 is connected to the lower end of the supporting member 23. The elevation mechanism 24 moves the mounting table 2 up and down between the transfer position indicated by the two-dot chain line and the processing position thereabove.

A brim-shaped supporting plate 25 is horizontally attached to the supporting member 23 below the bottom wall of the processing chamber 1. A bellows 26 is disposed between the bottom wall of the processing chamber 1 and the supporting plate 25 so as to isolate the air in the processing chamber 1 from the outside and so as to extend and contract in response to the elevation movement of the supporting plate 25.

Under the mounting table 2, for example, three supporting pins 27 are disposed to support and lift the wafer W at its lower surface when the wafer W is transferred from/to an external wafer transfer mechanism (only two supporting pins are illustrated in FIG. 1). The supporting pins 27 are connected to an elevation mechanism 28 so that they can move up and down. The supporting pins 27 are protruded above and retracted below the upper surface of the mounting table 2, through through-holes 2a that vertically penetrate the mounting table 2. Accordingly, the wafer W can be transferred between the supporting pins 27 and the wafer transfer mechanism (not shown) that has entered the processing chamber 1.

The cap member 3 is disposed under the top plate 13 so as to face the mounting table 2. The cap member 3 and the top plate 13 are fastened with a bolt (not shown).

The lower surface of the cap member 3 has a depressed portion 31 having an upside-down bowl shape with its sloped surface widening in the radial direction. At the outer edge of the sloped surface, a flat rim 32 is formed.

By elevating the mounting table 2 to the processing position, the upper surface of the cover member 22 around the mounting table 2 and the lower surface of the rim 32 of the cap member 3 face each another. By doing so, a space defined by the depressed portion 31 of the cap member 3 and the upper surface of the mounting table 2 becomes the processing space S where a film forming process is performed on the wafer W. At this time, the position in the height direction of the mounting table 2 is set to form a gap 33 between the lower surface of the rim 32 of the cap member 3 and the upper surface of the cover member 22. Preferably, the depressed portion 31 is formed so that the volume of the processing space S is as small as possible and thus gas substitution is improved when processing gases are substituted with a purge gas.

In the center portion of the cap member 3, a gas supply channel 34 is formed so as to supply the processing gases and the purge gas into the processing space S. The gas supply channel 34 passes through the center portion of the cap member 3, and the lower end of the gas supply channel 34 serves as injection port 35. The injection port 35 is located at a position corresponding to the central portion of the wafer W placed on the mounting table 2.

Flow channel forming members 3a are inserted in the upper portion of the center of the cap member 3. By the flow channel forming members 3a, the upper stream side of the gas supply channel 34 branches into a $TiCl_4$ gas supply channel 36 for supplying $TiCl_4$ gas and $N_2$ gas for purge, and a $NH_3$ gas supply channel 37 for supplying $NH_3$ gas and $N_2$ gas for purge. The $TiCl_4$ gas supply channel 36 and the $NH_3$ gas supply channel 37 further penetrate through the top plate 13 and open in the upper surface of the top plate 13. Below the injection port 35, a dispersion plate 38 is disposed to disperse, in the processing space S, the gas injected from the injection port 35 via the gas supply channel 34. The dispersion plate 38 is held by a holding rod 38a. The holding rod 38a is fixed to the flow channel forming members 3a. The gas injected from the injection port 35 collides with the dispersion plate 38, so that the flow direction of the gas is changed and the gas is uniformly dispersed. Accordingly, the dispersion plate 38 allows the processing gases to arrive at the surface of the wafer W at a more uniform density.

The gas supply unit 4 includes a $TiCl_4$ gas supply source 41 for supplying $TiCl_4$ gas which is a first processing gas, a $NH_3$ gas supply source 42 for supplying $NH_3$ gas which is a second processing gas, and a first and a second $N_2$ gas supply source 43 and 44 for supplying $N_2$ gas serving as a purge gas. The $TiCl_4$ gas supply source 41 is connected to a $TiCl_4$ gas supply line 45. The $NH_3$ gas supply source 42 is connected to a $NH_3$ gas supply line 46. In addition, the first and the second $N_2$ gas supply source 43 and 44 are connected to a first $N_2$ gas supply line 47 and a second $N_2$ gas supply line 48, respectively. Further, the $TiCl_4$ gas supply line 45 is connected to a $TiCl_4$ gas supply channel 36. The $NH_3$ gas supply line 46 is connected to the $NH_3$ gas supply channel 37. The first and the second $N_2$ gas supply line 47 and 48 are connected to the $TiCl_4$ gas supply line 45 and the $NH_3$ gas supply line 46, respectively. In addition, a flow rate controller 4a, such as a mass flow controller, and an opening/closing valve 4b are provided at each of the gas supply lines. It is to be noted that although two $N_2$ gas supply sources 43 and 44 are illustrated in FIG. 1 for the sake of convenience, a single $N_2$ gas supply source may be used. Further, the purge gas is not limited to $N_2$ gas but may be other gases including a rare gas or the like.

The exhaust unit 5 includes the above-described exhaust duct 51, an exhaust line 55 connected to the exhaust duct 51, an automatic pressure control (APC) valve 56 to control pressure in the processing space S by adjusting an exhaust rate of the exhaust line 55, a trap 57 for trapping reaction products flowing in the exhaust line 55, and a vacuum pump 58. The APC valve 56, the trap 57 and the vacuum pump 58 are connected to the exhaust line 55 in this order from the upstream side.

The exhaust duct 51 has a square-shaped cross-section and has a gas flow channel 52 formed therein. In the inner circumferential surface of the exhaust duct 51, a slit-shaped opening 53 is formed along the whole circumference. Further, at the outer wall of the exhaust duct 51, an exhaust port 54 is formed. The exhaust line 55 is connected to the exhaust port 54. The slit-shaped opening 53 is formed to correspond to the gap 33 that is created when the mounting table 2 is elevated to the processing position. Accordingly, by operating the vacuum pump 58, the gas in the processing space S reaches the gas flow channel 52 in the exhaust duct 51 through the gap 33 and the opening 53, and is exhausted through the exhaust line 55.

The control unit 6 includes a process controller 61 that has a microprocessor (computer) to control the respective components of the film forming apparatus 100, e.g., the flow rate controller 4a, the opening/closing valve 4b, the vacuum pump 58, and the elevation mechanism 24, and the like. The process controller 61 is connected to a user interface 62. The user interface 62 includes, for example, a keyboard that is used by an operator to input commands or the like for managing the film forming apparatus 100, and a display on which the working situation of the film forming apparatus 100 is visually displayed. The process controller 61 is also connected to a storage unit 63. The storage unit stores therein process recipes and various kinds of databases. The process recipes include a control program for executing, under the control of the process controller 61, various kinds of processes to be carried out in the film forming apparatus 100, e.g., supplying a processing gas or exhausting a gas from the processing chamber, and a control program for instructing the respective components of the film forming apparatus 100 to perform a predetermined process based on processing conditions. The recipes are stored in an appropriate storage medium (not shown) in the storage unit 63. If necessary, by invoking and executing a certain recipe from the storage unit 63 by the process controller 61, a desired process is carried out in the film forming apparatus 100 under the control of the process controller 61.

(Film Forming Method)

Next, a film forming method performed by the film forming apparatus 100 configured as above will be described.

Initially, the gate valve 12 is opened at a state where the mounting table 2 is lowered to the transfer position, and then the wafer W held on a transfer arm (not shown) is loaded in through the loading/unloading port 11. Then, the wafer W is mounted on the mounting table 2 by the operation of the supporting pins 27. Subsequently, the pressure in the processing chamber 1 is adjusted to a predetermined value, and the mounting table 2 is elevated to the processing position to form the processing spaces S.

At this state, $N_2$ gas for purge is supplied from the gas supply unit 4 into the processing space S, and $TiCl_4$ gas and $NH_3$ gas are supplied alternately and intermittently, so that a TiN film is formed on the wafer W by the ALD technique.

Figure 3:
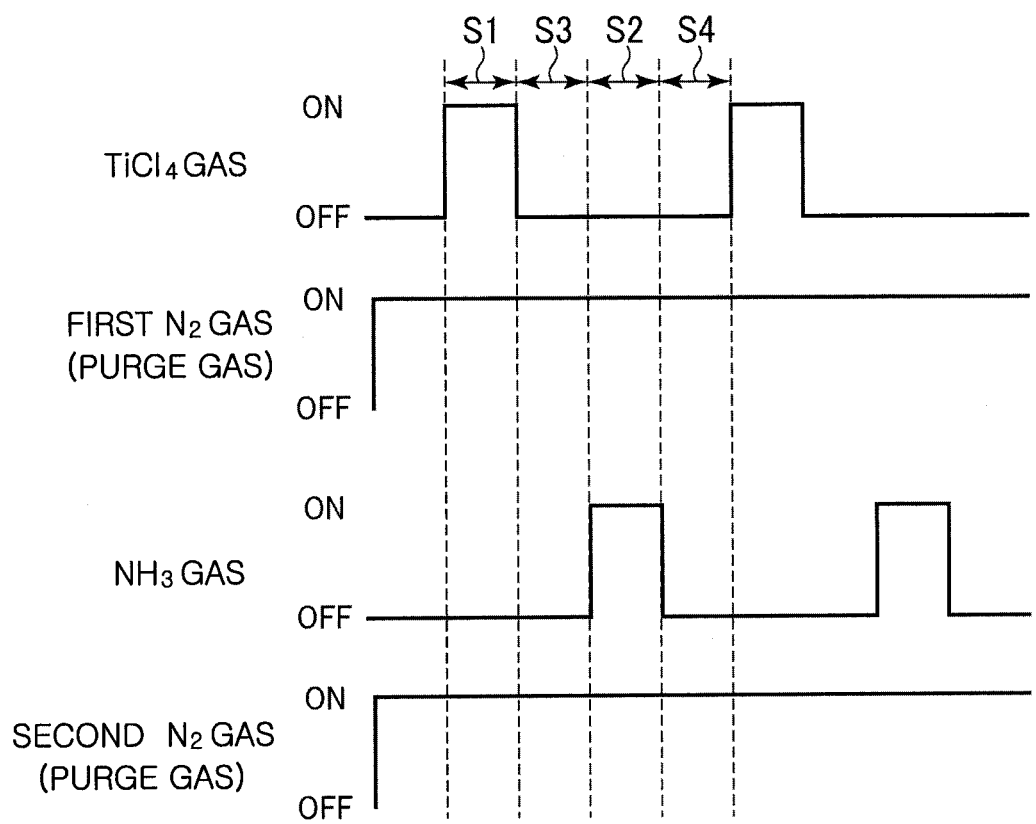
FIG. 3 is a timing chart for illustrating a film forming method in accordance with an embodiment of the present invention.

Specifically, as illustrated in FIG. 3, as the purge gas, the first $N_2$ gas from the first $N_2$ gas supply source 43 and the second $N_2$ gas from the second $N_2$ gas supply source 44 are constantly supplied at a predetermined flow rate, while $TiCl_4$ gas and $NH_3$ gas are alternately and intermittently supplied. By doing so, the $TiCl_4$ gas supply step S1 and the $NH_3$ gas supply step S2 are repeated alternately while the purge step S3 or S4 of supplying $N_2$ gas only is performed between the steps S1 and S2. In this manner, $TiCl_4$ gas is adsorbed on the wafer W in the initial $TiCl_4$ gas supply step S1, excessive $TiCl_4$ gas is purged out in the following purge step S3, $NH_3$ gas supplied in the following $NH_3$ gas supply step S2 reacts with $TiCl_4$ gas, and excessive $NH_3$ gas is purged out in the following purge step S4. As a result, a thin unit film, which is almost a monomolecular layer, is formed. By repeating such a series of operations, a TiN film having a desired film thickness is formed.

When a film is formed by the ALD technique, a unit film of an almost monomolecular layer is formed in the ALD mode in which processing gases are supplied to a substrate, and subsequently, excessive processing gases are purged out, so that only surface reaction is generated and film thickness is controlled in a self-limiting manner.

In this connection, purging by a purge gas is carried out at a high flow rate in order to achieve good gas substitution. Conventionally, however, if the pressure in a processing space increases, gas substitution efficiency decreases even if the purge gas is at a high flow rate, so that deposition takes place as in the CVD mode, as well as surface reaction. Therefore, it has been considered that the controllability of film thickness becomes bad. However, if the pressure in the processing space is reduced, a trap disposed in an exhaust line limits the gas substitution rate, thereby decreasing the gas substitution efficiency eventually.

Figure 4:
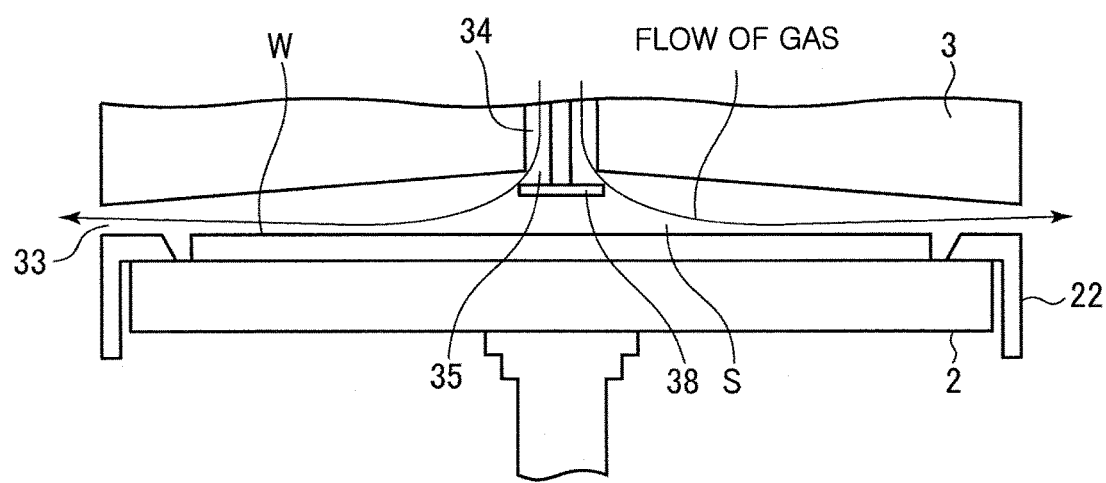
FIG. 4 is a view for illustrating the flow of gas in a processing space when a film forming method in accordance with an embodiment of the present invention is performed.

In contrast, the present embodiment adopts, in a film forming process, a gas supply scheme in which $N_2$ gas serving as a purge gas is constantly supplied and $TiCl_4$ gas and $NH_3$ gas are alternately and intermittently supplied. With this scheme, the gas substitution efficiency by the purge gas is greatly increased. That is to say, as illustrated in FIG. 4, a gas is injected from the injection port 35 into the processing space S, and dispersed outwardly by the dispersion plate 38, and then flows outwardly on the surface of the wafer W to be discharged through the gap 33. Accordingly, gas flow of $N_2$ gas, serving as a purge gas supplied all the time, is formed on the surface of the wafer W. Therefore, when $TiCl_4$ gas or $NH_3$ gas is supplied, excessive gas which does not contribute to the surface reaction is rapidly discharged along with the gas flow of the $N_2$ gas. Further, it has been newly found that, by using this gas supply scheme, as long as the flow rate of the purge gas is a predetermined value or above, a film can be formed mostly in the ALD mode, irrespective of the pressure in the processing space.

Specifically, even if the gas supply scheme, in which $N_2$ gas serving as a purge gas is constantly supplied and $TiCl_4$ gas and $NH_3$ gas are alternately and intermittently supplied, is adopted, in an area where the flow rate of $N_2$ gas for purge is lower than the predetermine value, a film may be formed in the ALD mode (i.e., a film forming mode in which control over film thickness is held effective by the ALD technique) when the pressure in the processing space S is low, whereas a film may be formed in the CVD mode (i.e., the mode in which film formation as well as surface reaction take place by CVD) when the pressure is high, thereby making the film thicker. In contrast to this, if the flow rate of $N_2$ gas is equal to or higher than the predetermined value, a film can be formed mostly in the ALD mode even if the pressure in the processing space becomes high.

In view of this, according to the present embodiment, in addition to introducing the scheme in which $N_2$ gas serving as a purge gas is constantly supplied and $TiCl_4$ gas and $NH_3$ gas are alternately and intermittently supplied, the flow rate of $N_2$ gas is set to be a flow rate that allows a film to be formed in a film forming mode in which the ALD mode is primarily used, irrespective of the pressure in the processing space.

By doing so, even if the pressure in the processing space S is set high so that the trap 57 does not limit the gas substitution rate (e.g., 5 Torr (666.5 Pa) or higher), it is possible to improve the substitution efficiency of a gas in the processing space S to thereby ensure good control over the film thickness.

When it comes to the pressure in the processing chamber, it has been considered conventionally that if the pressure is so high that the trap 57 does not limit the gas substitution rate, e.g., 5 Torr (666.5 Pa) or higher, the CVD mode takes place. However, as described above, by introducing the gas supply scheme, there exists a flow rate at which a film can be formed mostly in the ALD mode even if the pressure in the processing space S is set high so that the trap 57 does not limit the substitution rate of the purge gas in the processing space S.

Accordingly, in addition to introducing the gas supply scheme, the pressure in the processing space S may be set high so that the trap 57 does not limit the substitution rate of the purge gas in the processing space S, and the flow rate of $N_2$ gas serving as a purge gas may be set to be a flow rate that allows a film to be formed in a film forming mode in which the ALD mode is primarily used at that pressure. In this instance, it is not necessary to set the flow rate of $N_2$ gas to be a flow rate that allows a film to be formed in the ALD mode irrespective of the pressure in the processing space.

The present embodiment can have an additional effect as described below. Since $N_2$ gas, which is a purge gas, is constantly supplied, gases can be switched by on/off only the supply of $TiCl_4$ gas and $NH_3$ gas, which are the processing gases, so that it takes much shorter time to switch the gases.

In order to obtain a flow rate at which a film can be formed in the ALD mode irrespective of the pressure in the processing space by improving the gas substitution efficiency, it is preferred that the volume of the processing space S is as smaller as possible, preferably 1,700 mL or less. However, since there is a limit to reduce the processing space S practically, the volume of the processing space S is preferably between 650 mL and 1,700 mL. According to the present embodiment, $N_2$ gas, which is a purge gas, is constantly supplied so that the gas substitution rate is good. Therefore, there exists a flow rate that allows a film to be formed in the ALD mode irrespective of the pressure in the processing space, even if the volume of the processing space S is set to be about 1,700 mL which is relatively large. In addition, the flow rate of $N_2$ gas that allows a film to be formed in the ALD mode irrespective of the pressure in the processing space varies depending on the volume of the processing space S. If the volume of the processing space S is between 1,300 mL and 1,700 mL, which are close to the upper limit of the preferred range, it is preferable that the sum of the flow rates of the first $N_2$ gas and the second $N_2$ gas, which are purge gases, is 8,500 mL/min (sccm) or higher. Further, in the case where the volume of the processing space S is between 1,300 mL and 1,700 mL, by setting the flow rate of $N_2$ gas to be 8,500 mL/min (sccm) or higher, a film forming mode in which the ALD mode is primarily used can be realized even if the pressure in the processing space S is 5 Torr (666.5 Pa) or higher at which the trap 57 does not limit the gas substitution rate.

Further, by setting the volume of the processing space S to be a small value between 650 mL and 850 mL, and the flow rate of $N_2$ gas to be 5,000 mL/min (sccm) or higher, a film can be formed in the ALD mode without generating the CVD mode, irrespective of the pressure in the processing space S. Furthermore, in the case where the volume of the processing space S is a value between 650 mL and 850 mL, a film forming mode where the ALD mode is primarily used can be realized by setting the flow rate of $N_2$ gas to be 5,000 mL/min (sccm) or higher, even if the pressure in the processing space S is 5 Torr (666.5 Pa) or higher at which the trap 57 does not limit the gas substitution rate.

A TiN film which has been formed in the ALD mode with good controllability over film thickness has small variations (unevenness) in film thickness and small specific resistance of the film and small variations in the specific resistance.

The other conditions when forming a TiN film by the ALD technique are as follows:
the substrate temperature (mounting table temperature): 350° C. to 550° C., the flow rate of $TiCl_4$ gas: 30 mL/min (sccm) to 200 mL/min (sccm), and the flow rate of $NH_3$ gas: 1,000 mL/min (sccm) to 4,000 mL/min (sccm).

After a TiN film is completely formed by the ALD technique in the above-described manner, the mounting table 2 is lowered to the transfer position. Then, the wafer W is elevated by the supporting pins 27, the gate valve 12 is opened to allow a transfer arm (not shown) to enter the processing chamber 1 through the loading/unloading port 11, and the transfer arm takes the wafer W and brings it out of the processing chamber 1.

EXPERIMENTAL EXAMPLE

Next, experimental examples in which the film forming method according to the present invention is actually practiced will be described.

Experimental Example 1

An apparatus having the configurations illustrated in FIG. 1 with the volume of the processing space of 1,700 mL was used. By using $TiCl_4$ gas and $NH_3$ gas as the processing gases and $N_2$ gas as the purge gas, a TiN film was formed by the ALD technique.

In this example, operating conditions were set as follows: the mounting table temperature (substrate temperature) of 440° C., the flow rate of $TiCl_4$ gas in one cycle of 50 mL/min (sccm), the flow rate of $NH_3$ gas in one cycle of 2,700 mL/min (sccm), the time period of step S1 of FIG. 3 ($TiCl_4$ gas supplying time) of 0.05 sec, the time period of step S2 ($NH_3$ gas supplying time) of 0.3 sec, and the purge time period of each of steps S3 and S4 of 0.3 sec. The steps S1 to S4 were repeated 315 cycles, varying the pressure in the processing space (the pressure in the processing chamber) between 3 Torr and 7 Torr (between 400 Pa and 933 Pa) and varying the flow rate of $N_2$ gas between 6,000 mL/min and 10,000 mL/min (sccm).

Figure 5A:
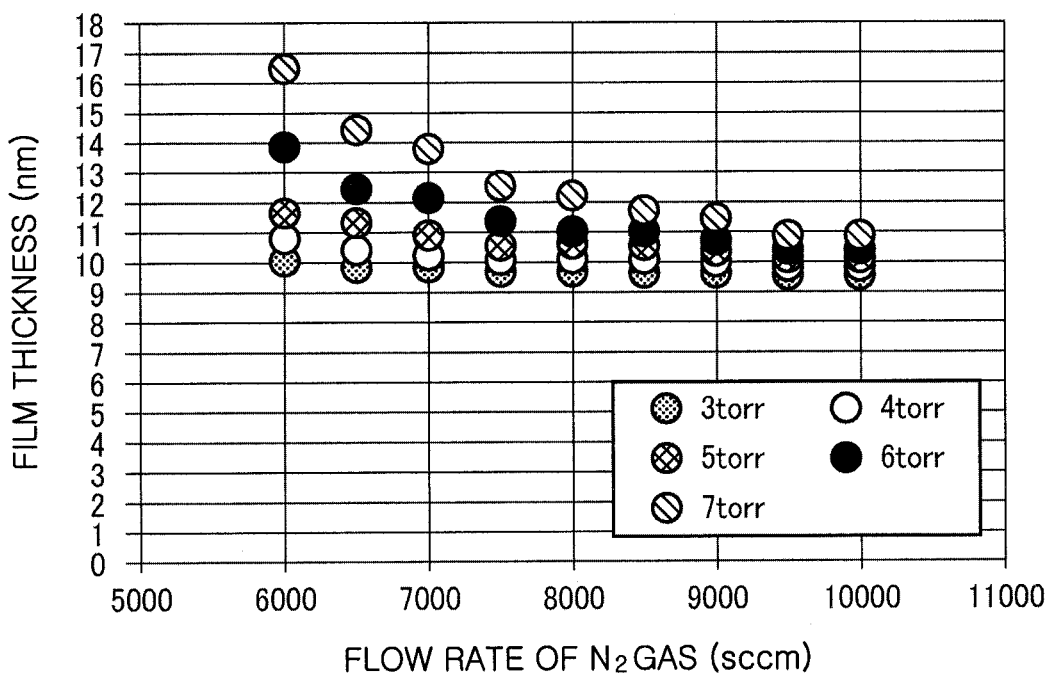
FIG. 5A is a diagram for illustrating the relationship between the flow rate of $N_2$ gas and film thickness under various pressures in Experiment Example 1.
Figure 5B:
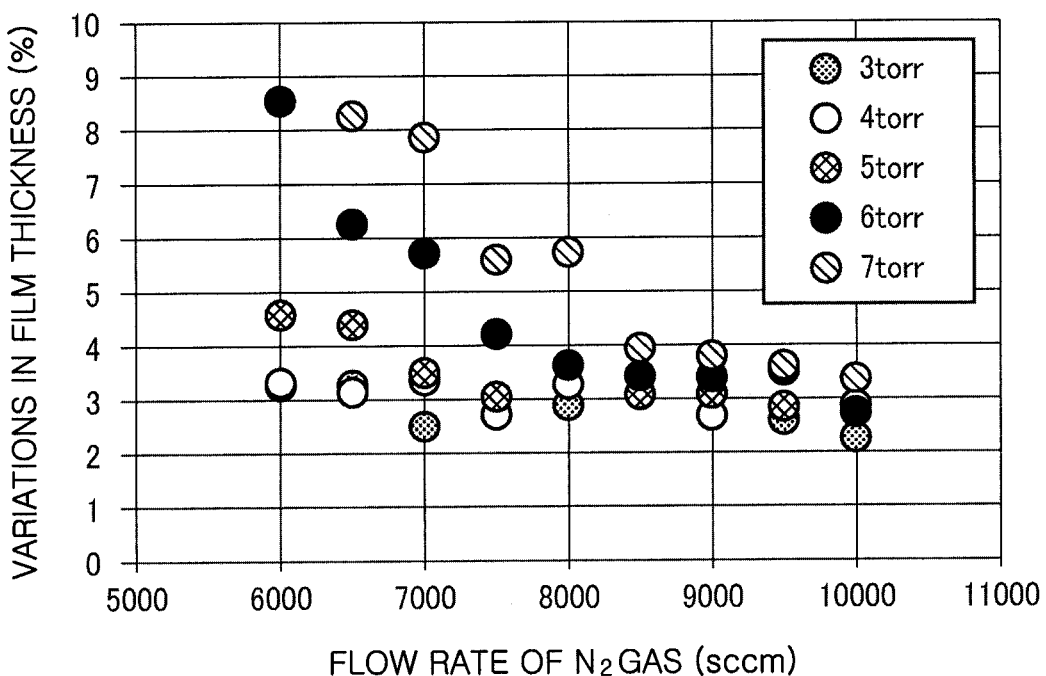
FIG. 5B is a diagram for illustrating the relationship between the flow rate of $N_2$ gas and variations in the film thickness under the various pressures.
Figure 6A:
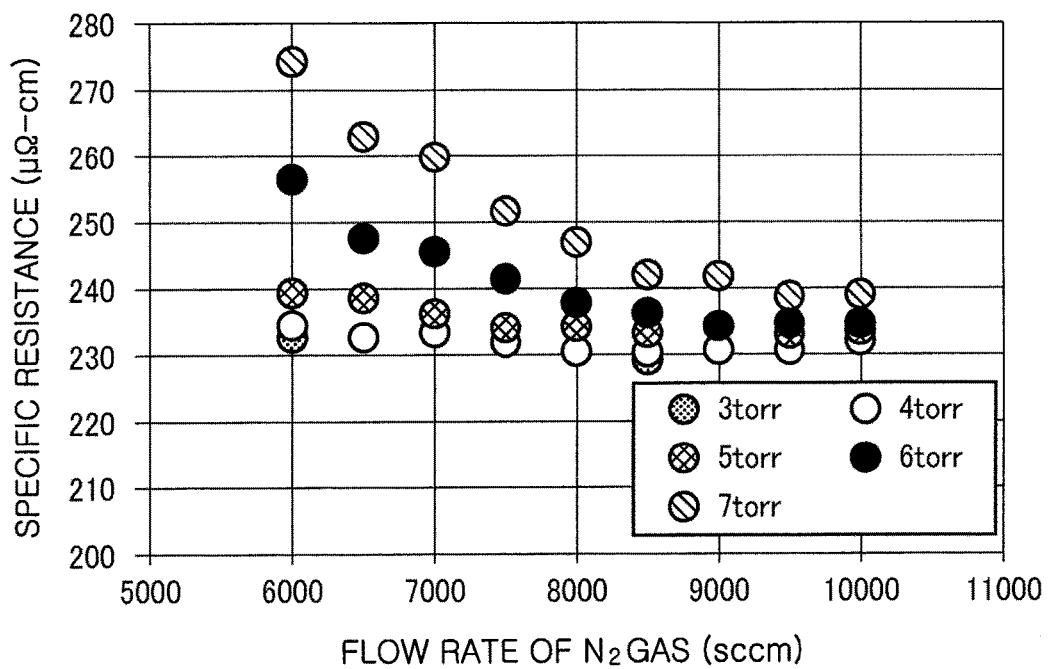
FIG. 6A is a diagram for illustrating the relationship between the flow rate of $N_2$ gas and specific resistance of a film under various pressures in Experimental Example 1.
Figure 6B:
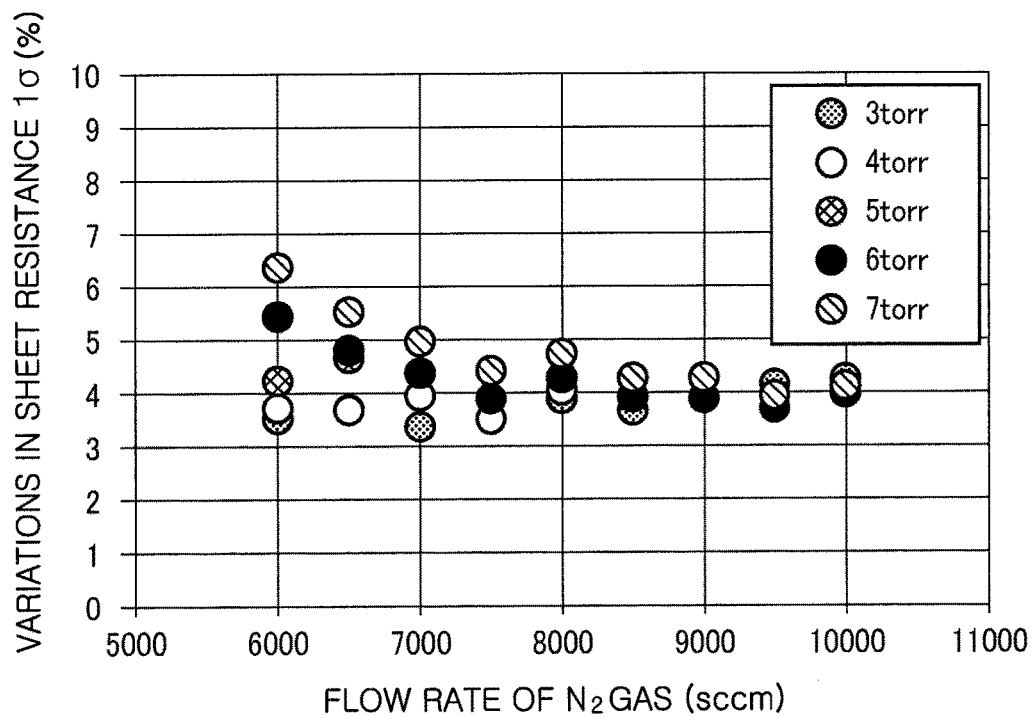
FIG. 6B is a diagram for illustrating the relationship between the flow rate of $N_2$ gas and sheet resistance of the film under the various pressures.

In this connection, FIG. 5A illustrates the relationship between the flow rate of $N_2$ gas and the film thickness under various pressures, and FIG. 5B illustrates the relationship between the flow rate of $N_2$ gas and variations in the film thickness under the various pressures. Further, FIG. 6A illustrates the relationship between the flow rate of $N_2$ gas and the specific resistance of the film under the various pressures, and FIG. 6B illustrates the relationship between the flow rate of $N_2$ gas and variations in the sheet resistance of the film under the various pressures.

As can be seen from FIGS. 5A and 5B, when the flow rate of $N_2$ gas is 6,000 mL/min (sccm), the film thickness is stable and the film thickness can be controlled in the ALD mode if the pressure in the processing space is 5 Torr or below. However, if the pressure in the processing space is above 5 Torr, the film thickness rapidly increases and the CVD mode is generated. The higher the pressure is, the larger the variations in the film thickness tend to be. As can be seen from FIGS. 6A and 6B, the specific resistance and the variations in the sheet resistance exhibit similar patterns.

In contrast, as the flow rate of $N_2$ gas is increased, it can be seen that the film thickness tends to be decreased in the areas where the pressure in the processing space is high, so that the CVD mode tends to be less generated. Further, as the flow rate of $N_2$ gas becomes 8,500 mL/min (sccm) or higher, the differences in film thickness due to the pressure become smaller, and so do the values of the specific resistance and the variations in the sheet resistance. Accordingly, it has been found that a desired film can be formed in the film forming mode where the ALD mode is primarily used, irrespective of the pressure in the processing space.

Figure 7:
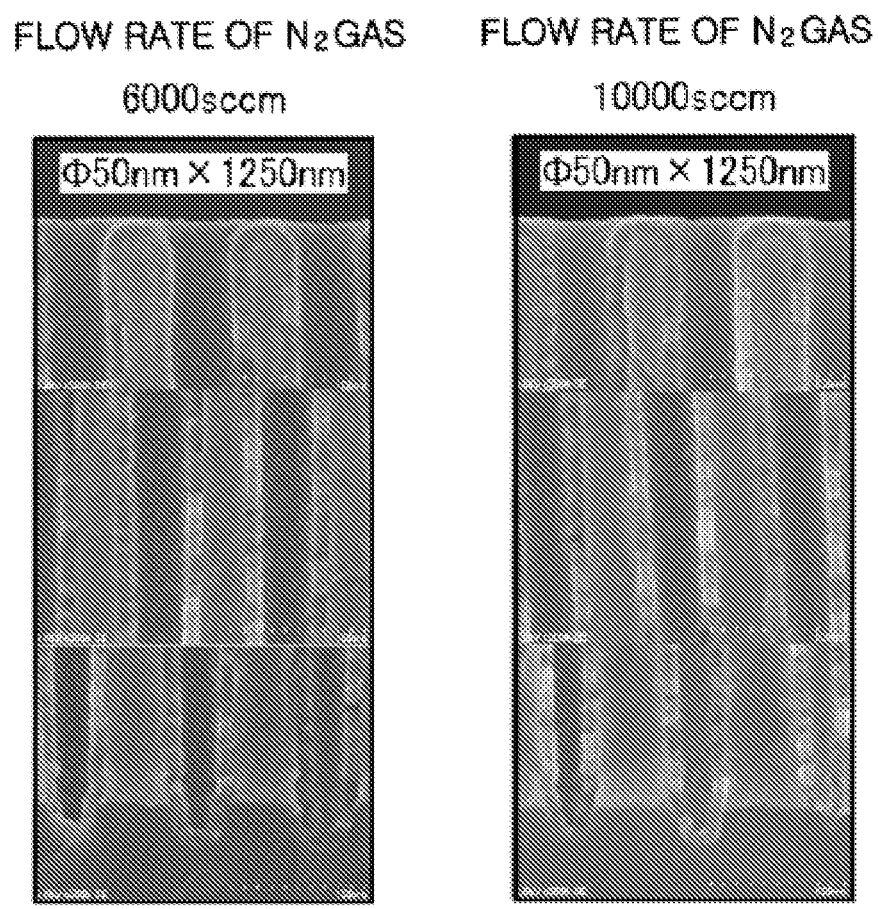
FIG. 7 is a set of SEM (scanning electron microscope) photographs that compares step coverage when the flow rate of $N_2$ gas serving as a purge gas is 6,000 sccm with step coverage when the flow rate of $N_2$ gas is 10,000 sccm.

A film forming process was performed on a hole having the diameter of 50 nm and the depth of 1,250 nm, with the flow rate of $N_2$ gas of 6,000 mL/min (sccm) (pressure: 5 Torr) and with the flow rate of $N_2$ gas of 10,000 mL/min (sccm) (pressure: 10 Torr). As a result, as can be seen from the SEM (scanning electron microscope) photographs in FIG. 7, it has been found that good step coverage is achieved irrespective of the flow rate of $N_2$ gas.

Experimental Example 2

Next, an apparatus having the configurations illustrated in FIG. 1 with the volume of the processing space of 650 mL was used. By using $TiCl_4$ gas and $NH_3$ gas as the processing gas and $N_2$ gas as the purge gas, a TiN film was formed by the ALD technique.

In this example, similarly to Experimental Example 1, operating conditions were set as follows: the mounting table temperature (substrate temperature) of 440° C., the flow rate of $TiCl_4$ gas in one cycle of 50 mL/min (sccm), the flow rate of $NH_3$ gas in one cycle of 2,700 mL/min (sccm), the time period of step S1 of FIG. 3 ($TiCl_4$ gas supplying time) of 0.05 sec, the time period of step S2 ($NH_3$ gas supplying time) of 0.3 sec, the purge time of each of steps S3 and S4 of 0.3 sec. The steps S1 to S4 were repeated 315 cycles, varying the pressure in the processing space (the pressure in the processing chamber) between 3 Torr and 7 Torr (between 400 Pa and 933 Pa) and varying the flow rate of $N_2$ gas between 5,000 mL and 9,000 mL (sccm).

Figure 8:
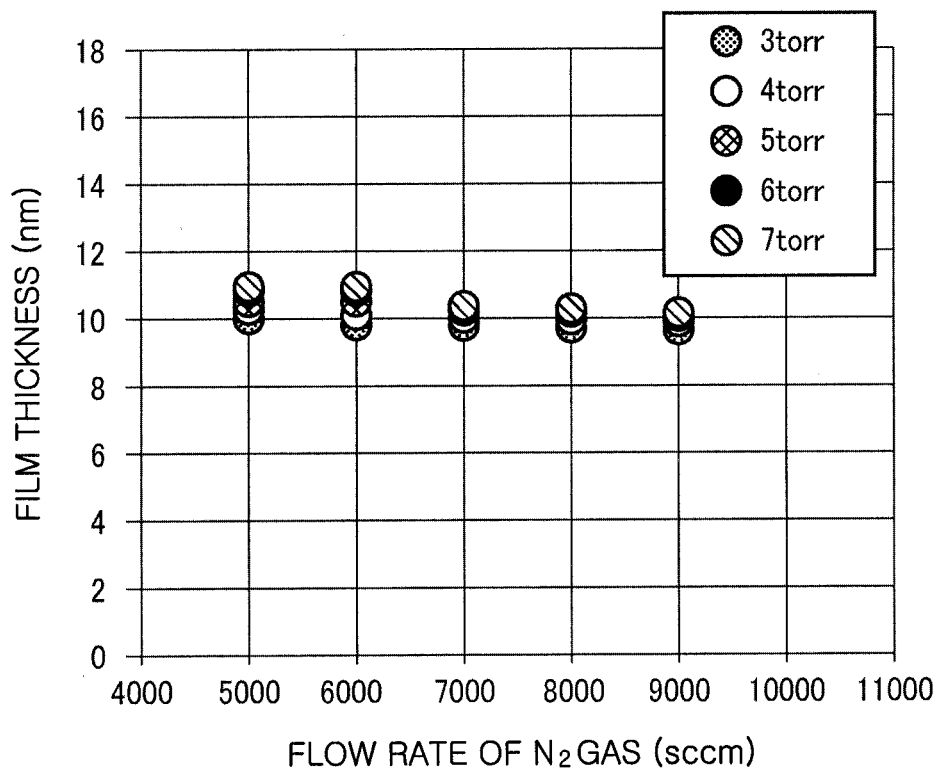
FIG. 8 is a diagram for illustrating the relationship between the flow rate of $N_2$ gas and film thickness under various pressures in Experimental Example 2.
Figure 9:
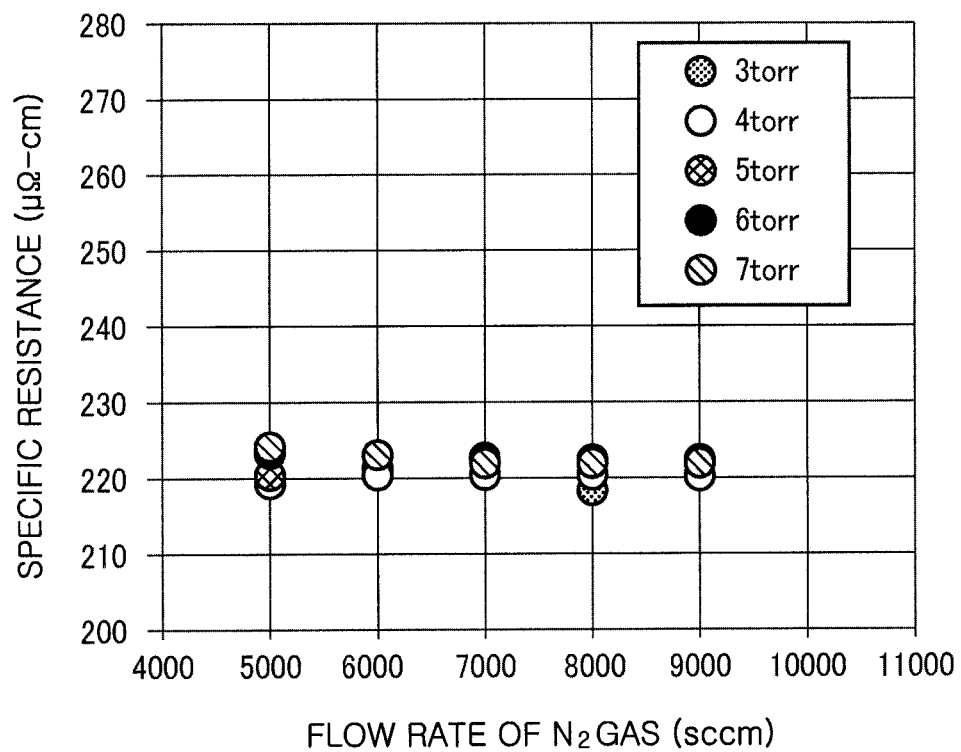
FIG. 9 is a diagram for illustrating the relationship between the flow rate of $N_2$ gas and specific resistance of a film under various pressures in Experimental Example 2.

In this connection, FIG. 8 illustrates the relationship between the flow rate of $N_2$ gas and the film thickness under various pressures, and FIG. 9 illustrates the relationship between the flow rate of $N_2$ gas and the specific resistance of the film under the various pressures.

As illustrated in FIGS. 8 and 9, by reducing the volume of the processing space to 650 mL, the film thickness is almost the same independently of the pressure in the processing space, even if the flow rate of $N_2$ gas is 5,000 mL/min (sccm). Accordingly, it has been found that the film can be formed mostly in the ALD mode at a lower flow rate of the purge gas, irrespective of the pressure in the processing space. Further, when the flow rate of $N_2$ gas is 5,000 mL/min (sccm) or higher, it has been found that the specific resistance of the film is also substantially the same, irrespective of the pressure in the processing space.

(Other Applications)

Thus far, the embodiments of the present invention have been described. However, the present invention is not limited to the above-described embodiments but may be variously modified. For example, although $TiCl_4$ gas and $NH_3$ gas are used to form a TiN film by the ALD technique in the above-described embodiments, the kinds of processing gases and materials of the film are not limited thereto. The principle of the present invention can be applied in forming a film by the ALD technique by using various kinds of processing gases. Also, the purge gas is not specifically limited but may be appropriately selected in association with the processing gases. In addition, it is needless to say that the kinds of the processing gases are not limited to two but three or more kinds of gases may be used to form a film by the ALD technique.

Moreover, although the processing space of the film forming apparatus has the upside-down bowl shape in the above-described embodiments, the shape of the processing space is not limited thereto. Further, although the dispersion plate is located under the injection port through which a gas is injected into the processing space in the above-described embodiments, it is merely illustrative and other structures such as a shower structure may be used. In addition, although the gas lines to supply the purge gases are connected to the respective processing gas supply lines in the above-described embodiments, they may be separately provided from the processing gas supply lines. Other components of the film forming apparatus are merely illustrative and other configurations may be possible as long as the film forming method according to the present invention can be realized.

Further, a semiconductor wafer has been described as a target substrate in the above-described embodiments. However, it is apparent that the target substrate is not limited to the semiconductor wafer but may be a glass substrate for a FPD (flat panel display) such as a liquid crystal display or a ceramic substrate.

While the invention has been shown and described with respect to the embodiments, it will be understood by those skilled in the art that various changes and modifications may be made without departing from the scope of the invention as defined in the following claims.

What is claimed is:

1. A film forming method, the method comprising:
    forming a thin unit film on a target substrate by supplying processing gases sequentially and intermittently into a processing space, wherein the target substrate is placed in the processing space, in a processing chamber of a film forming apparatus while purging the processing gases with a purge gas continuously supplied into the processing space; and
    repeating said forming the thin unit film to form a film having a predetermined thickness on the target substrate,
    wherein the film forming apparatus includes an exhaust unit having a trap for trapping byproducts produced by a reaction between the processing gases,
    wherein a pressure in the processing chamber is set such that the trap does not limit a substitution rate at which the processing gases are substituted with the purge gas,
    wherein a flow rate of the purge gas supplied into the processing space is set such that the film is formed in an ALD (atomic layer deposition) mode at the pressure in the processing chamber,
    wherein the pressure in the processing chamber is in a range between 3 Torr and 7 Torr, wherein the flow rate of the purge gas is 5,000 mL/min or higher for a volume of the processing space in a range between 650 mL and 850 mL, and
    wherein the flow rate of the purge gas is 8,500 mL/min or higher for a volume of the processing space in a range between 1,300 mL and 1,700 mL.

2. A film forming method, the method comprising:
    forming a thin unit film on a target substrate by supplying processing gases sequentially and intermittently into a processing space, where the target substrate is placed, in a processing chamber of a film forming apparatus while purging the processing gases with a purge gas continuously supplied into the processing space; and repeating said forming the thin unit film to form a film having a predetermined thickness on the target substrate, wherein the film forming apparatus comprises an exhaust unit having a trap for trapping byproducts produced by a reaction between the processing gases, wherein a processing pressure in the processing space is set such that the trap does not limit a substitution rate at which the processing gases are substituted with the purge gas, and wherein a flow rate of the purge gas is set such that the film is formed in an ALD (atomic layer deposition) mode at the processing pressure.

3. The method of claim 1, wherein the film forming apparatus comprises a mounting table on which the target substrate is placed in the processing chamber and a cap member arranged above the mounting table and including a depressed portion, and the processing space is defined by the mounting table and the depressed portion of the cap member.

4. The method of claim 2, wherein the film forming apparatus comprises a mounting table on which the target substrate is placed in the processing chamber and a cap member arranged above the mounting table and including a depressed portion, and the processing space is defined by the mounting table and the depressed portion of the cap member.

5. The method of claim 1, wherein the processing gases includes $TiCl_4$ gas and $NH_3$ gas, and the film includes a TiN film.

6. The method of claim 2, wherein the processing gases includes $TiCl_4$ gas and $NH_3$ gas, and the film includes a TiN film.

7. The method of claim 1, wherein the flow rate of the purge gas supplied into the processing space is constant during said forming the thin unit film.

8. The method of claim 2, wherein the flow rate of the purge gas supplied into the processing space is constant during said forming the thin unit film.

* * * * *